A method and an apparatus for measuring the strength of an AC electric field or an equivalent voltage, or the strength of an AC magnetic field or an equivalent current, based on a light beam which is transmitted through and thus modulated by an optical sensing head due to the Pockel's and Faraday effects, while the sensing head is exposed to the AC electric and magnetic fields. The sensing head includes an optical material which exhibits the Pockel's effect and an optical material which exhibits the Faraday effect, or includes an optical material which exhibits both the Pockel's and Faraday effects. The modulated beam is applied to a light-sensitive element, which produces an electric output signal. A first and a second component of the electric output signal are retrieved by respective detectors. The first component has a same frequency as that of the electric or magnetic field, while said second component has a frequency which is two times that of said electric or magnetic field. The electric field strength or the voltage, and the magnetic field strength or the current are determined by one and the other of the first and second components, respectively.

United States Patent
Kozuka et al.

[11] Patent Number: 4,933,629
[45] Date of Patent: Jun. 12, 1990

[54] METHOD AND APPARATUS FOR OPTICALLY MEASURING ELECTRIC AND MAGNETIC QUANTITIES HAVING AN OPTICAL SENSING HEAD EXHIBITING THE POCKEL'S AND FARADAY EFFECTS

[75] Inventors: Yoshinari Kozuka; Yuichi Kakizaki, both of Nagoya; Takayuki Sekiya, Kasugai; Hiroaki Abe, Nagoya, all of Japan

[73] Assignee: NGK Insulators, Ltd., Japan

[21] Appl. No.: 376,633

[22] Filed: Jul. 7, 1989

[30] Foreign Application Priority Data

Jul. 9, 1988 [JP] Japan ................................ 63-171322

[51] Int. Cl.[5] ...................... G01R 31/00; G01R 33/02; G02B 5/30; G02F 1/29
[52] U.S. Cl. ..................................... 324/96; 324/244; 350/375; 250/225
[58] Field of Search .......................... 324/96, 244, 262; 350/374, 375, 376; 250/225, 227; 356/72

[56] References Cited
FOREIGN PATENT DOCUMENTS
58-99761 6/1983 Japan .
59-50369 3/1984 Japan .

Primary Examiner—Gerard R. Strecker
Assistant Examiner—Walter E. Snow
Attorney, Agent, or Firm—Arnold, White & Durkee

[57] ABSTRACT

13 Claims, 9 Drawing Sheets

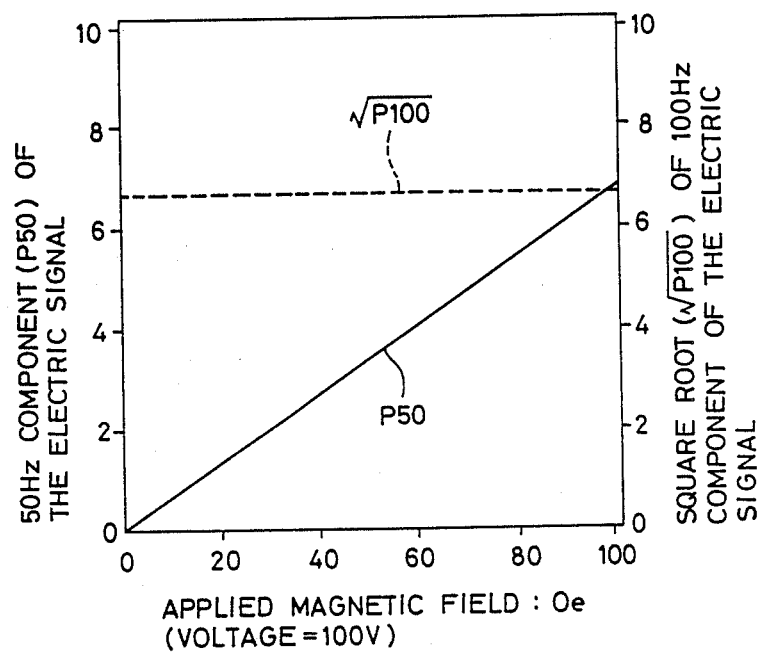

METHOD AND APPARATUS FOR OPTICALLY MEASURING ELECTRIC AND MAGNETIC QUANTITIES HAVING AN OPTICAL SENSING HEAD EXHIBITING THE POCKEL'S AND FARADAY EFFECTS

BACKGROUND OF THE INVENTION

1. Field of the Invention

The present invention relates in general to a method and an apparatus for optically measuring or determining electric and magnetic quantities, and more particularly to improved method and apparatus adapted to measure an AC electric field or a voltage which produces the AC electric field, an AC magnetic field or an electric current which produces the AC magnetic field, and an electric power together with these quantities, by utilizing polarization of a light beam.

2. Discussion of the Prior Art

Recently, techniques utilizing the electrooptical effect or the Pockel's effect and the magnetooptical effect or the Faraday effect are drawing attention of the industries concerned with the art of measuring or determining electric and magnetic quantities or amounts such as a voltage or an electric field, an electric current or a magnetic field, and/or an electric power. These techniques use a beam of light as a medium for the measurement, and consequently assure a high degree of insulation from electromagnetic induction noises. This feature of the optical measuring method has been widely utilized in the field of electricity, for measuring the electric/magnetic quantities associated with power cables, electric wirings and other electric parts.

Such optical measurements of electric and/or magnetic quantities by utilizing a light beam may be effected by an apparatus, so-called, an optical sensor. For example, there are known an optical sensor for detecting a voltage (an electric field strength) by using the Pockel's effect, and a sensor for detecting an optical sensor for detecting an electric current (a magnetic field strength) by using the Faraday effect. However, either of these optical sensors is capable of detecting only one of these two quantities, voltage or current.

On the other hand, laid-open Publication Nos. 58-99761 and 59-50369 of unexamined Japanese Patent Applications propose an optical apparatus which uses a single optical sensor capable of measuring both a voltage (electric field strength) and a current (magnetic field strength). Described more specifically, the optical sensing apparatus for detecting the strengths of an electric field and a magnetic field, as disclosed in the Publication No. 58-99761, employs an optical material which exhibits both the Pockel's effect and the Faraday effect. This optical material is exposed to two light beams such that these two light beams are transmitted through the optical material, in respective directions which are perpendicular to each other. The strength of an electric field to which the optical material is exposed is measured based on the Pockel's effect of the optical material, while the strength of a magnetic field to which the material is exposed is measured by means of the Faraday effect of the material. The optical sensing apparatus for detecting the electric quantities, as disclosed in the Publication No. 59-50369, employs two light sources which emit respective light beams which are transmitted through respective Pockel's-effect element (an optical material exhibiting the Pockel's effect) and Faraday-effect element (an optical material exhibiting the Faraday effect). The Pockel's-effect element and the Faraday-effect element produce optical output signals indicative of different wavelengths. The amounts of current and voltage applied to the elements are measured based on the intensities of the optical output signals.

An optical apparatus for detecting an electric power is disclosed in laid-open Publication No. 61-172069 of unexamined Japanese Patent Application, wherein a light beam produced by a suitable light source is transmitted through a polarizer, and a Pockel's-effect element and a Faraday-effect element which are arranged in series. The light beam which has been transmitted through these two elements is incident upon an analyzer, which divides the transmitted beam into two components. These two components of the modulated light beam are received by respective two light-sensitive elements, which convert the received optical signals into equivalent electric signals. This apparatus determines the amount of AC electric power applied to the Pockel's- and Faraday-effect elements, based on the Pockel's and Faraday effects given to the incident light beam.

Thus, the conventional optical sensors are relatively complicated in construction. Namely, the conventional sensors for effecting simultaneous measurements of a voltage and a curent, use two light sources or two light beams, which lead to a relatively large number of optical components of the sensing head, resulting in a considerably complicated sensing system as a whole. Similarly, the conventional optical sensor for measuring the amount of electric power is complicated because of the use of two light-sensitive elements for receiving two components of an optically modulated light beam.

SUMMARY OF THE INVENTION

Therefore, it is a first object of the present invention to provide a method suitable for optical measurements of a voltage (or an electric field strength) and a current (or a magnetic field strength), and an optical measurement of an electric power, together with the voltage and current measurements, by using a single optical sensing head, without using two light sources or two light beams as required in the conventional sensors.

A second object of the invention is to provide a simple optical apparatus having a single sensing head, which is suitable for practicing the method indicated above.

The first object may be achieved according to one aspect of the present invention, which provides a method of optically measuring the strength of an AC electric field or a voltage which produces the AC electric field, or the strength of an AC magnetic field or a current which produces the AC magnetic field, based on a light beam which is transmitted through and thus modulated by optical sensing means due to the Pockel's effect and the Faraday effect, while the optical sensing means is exposed to the AC electric field and the AC magnetic field, the optical sensing means comprising an optical material which exhibits the Pockel's effect and another optical material which exhibits the Faraday effect, or comprising an optical material which exhibits both the Pockel's effect and the Faraday effect, the method comprising the steps of: applying the light beam modulated by the optical sensing means to light-sensitive means; retrieving a first component and a second component of an electric output signal produced by the light-sensitive means, the first component having a same frequency as that of the AC electric or magnetic field, while the second component having a frequency which is two times that of the AC electric or magnetic field; and determining the strength of the AC electric field or the voltage based on one of the first and second components, and the strength of the AC magnetic field or the current based on the other of the first and second components.

The method may further comprise a step of determining an amount of electric power based on the determined voltage and current.

The second object may be achieved according to another aspect of the present invention, which provide an apparatus for optically measuring the strength of an AC electric field or a voltage which produces the AC electric field, or the strength of an AC mangetic field or a current which produces the AC magnetic field, the apparatus including (a) light-emitting means for producing a light beam, (b) a polarizer which receives the light beam, (c) optical sensing means through which the light beam which has passed through the polarizer is transmitted, the optical sensing means comprising an optical material which exhibits the Pockel's effect and another optical material which exhibits the Faraday effect, or comprising an optical material which exhibits both the Pockel's effect and the Faraday effect, the light beam being modulated while being transmitted through the optical sensing means, according to the strengths of the AC electric and magnetic fields to which the optical sensing means is exposed, (d) an analyzer through which the modulated light beam is transmitted, and (e) light-sensitive means receiving the modulated light beam from the analyzer, wherein the improvement comprises: first-component retrieving means for retrieving a first component of an electric output signal produced by the light-sensitive means, the first component having a same frequency as that of the AC electric or magnetic field; second-component retrieving means for retrieving a second component of the electric output signal of the light-sensitive means, the second component having an frequency which is two times that of the AC electric or magnetic field; and determining means for determining the strength of the AC electric field or the voltage based on one of the first and second components, and the strength of the AC magnetic field or the current based on the other of the first and second components.

The apparatus may further comprise comprising means for determining an amount of electric power based on the voltage which is determined by the one component retrieved by the other of the first-component second-component retrieving means, and the other component retrieved by the other of the fist-component and second-component retrieving means.

In the optical measuring method and apparatus according to the present invention, the light beam is optically modulated by the optical sensing means, according to the strengths of the AC electric and magnetic fields to which the optical sensing means is exposed. The modulated light beam is converted into an equivalent electric signal, whose first and second components are retrieved. The first component has a frequency equal to that of the AC electric or magnetic field, while the second component has a frequency which is two times as high as that of the electric or magnetic field. The strength of the electric field or the equivalent voltage, and the strength of the magnetic field or the equivalent current are determined by one and the other of these first and second components of the electric signal. Further, the amount of electric power applied to the sensing means may be determined based on the voltage and current values determined. Thus, the instant method and apparatus do not use two light sources for producing two light beams, and permit simultaneous measurements of electric and magnetic quantities by a relatively simple structural arrangement. In this respect, the present invention is industrially significant.

BRIEF DESCRIPTION OF THE DRAWINGS

The present invention will be better understood by reading the following detailed description of the operating principles and presently preferred embodiments of the invention, when considered in connection with the accompanying drawings, in which.

DETAILED DESCRIPTION OF THE INVENTION

Principles of Measurement

Figure 1:
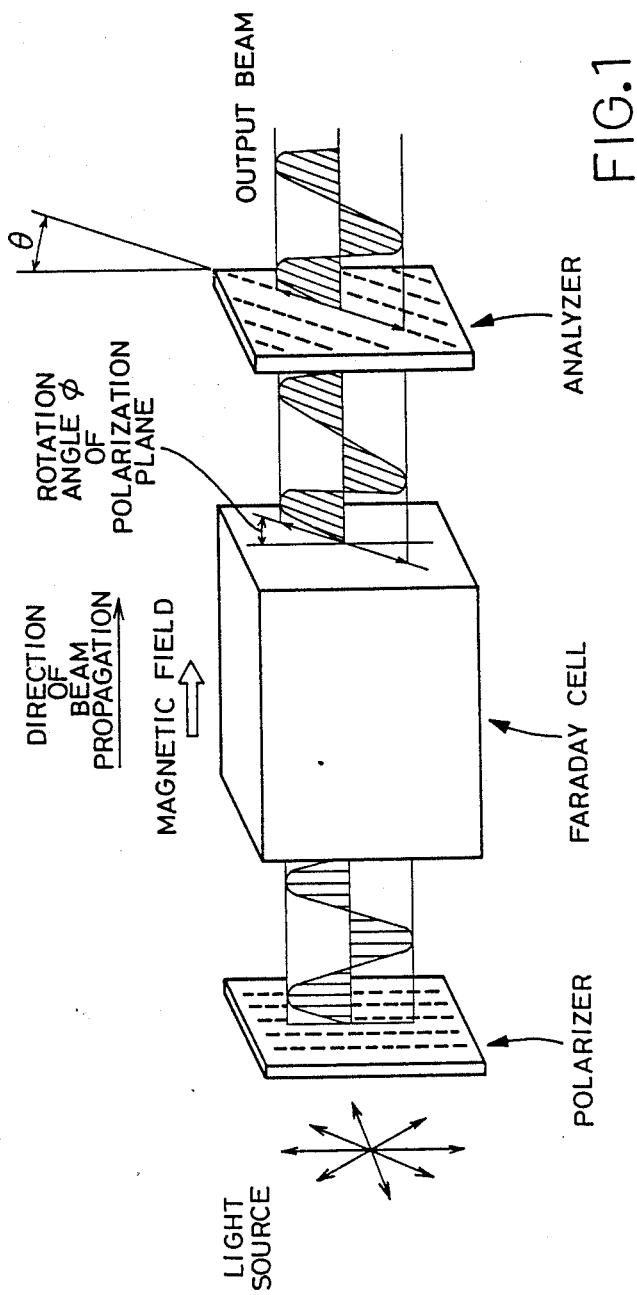
FIGS. 1 and 2 are views explaining the principles of measuring the strengths of an electric field and a magnetic field, according to the present invention.

As described above, the prevent invention provides a system of optically measuring the strength of an AC electric field acting on optical sensing means having the Pockel's effect and the Faraday effect on a polarized light beam, or a voltage which produces the AC electric current, and the strength of an AC magnetic field acting on the optical sensing means, or a current which produces the AC magnetic field. The principle of operation will be described below.

The Faraday effect is a phenomenon in which the plane of polarization of a polarized light beam which passes through a Faraday-effect element is rotated when the element is exposed to a magnetic field. An angle $\phi$ of rotation of the polarization plane of the light beam is represented by the following equation (1):

$$\phi = v \cdot H \cdot L \qquad (1)$$

where,
v: Verdet's constant
H: Strength of the magnetic field applied to the Faraday-effect element
L: Length of the Faraday-effect element Referring to FIG. 1, there is shown an arrangement for measuring the strength of a magenetic field by using a Faraday-effect element. On the opposite sides of the Faraday-effect element in the direction of propagation of a light beam, there are disposed a polarizer and an analyzer, such that the polarizer is located nearer to a light source (light-emitting means). The light beam produced by the light source is linearly polarized (plane-polarized) by the polarizer, and the linearly polarized beam is transmitted through the Faraday-effect element. As a result, the plane of polarization of the beam which has been emitted from the Faraday-effect element is rotated by an angle which is proportional to the strength of a magentic field to which the Faraday-effect element is exposed. The light beam whose polarization plane has been rotated is then transmitted through the analyzer whose plane of light incidence is different from that of the polarizer. The angle of rotation of the light beam by the Faraday-effect element is converted by the analyzer, into the amount of change in the quantity of the light beam which has been transmitted through the analyzer. Suppose the light incidence planes of the polarizer and analyzer has a relataive angular difference $\theta$ an intensity P of the magnetooptically modulated output beam emitted from the analyzer is expressed by the following equation (2) well known in the art:

$$P = cPo \cdot \cos^2(\phi + \theta) \tag{2}$$

where,
c: Proportion constant
Po: Intensity of the incident beam

Here, it is noted that $H = Ho \sin \omega t$, where $Ho \sin \omega t$ represents an AC magnetic field having a frequency $\omega$ and an amplitude Ho, and t represents time. Accordingly, the following equation (3) may be obtained from the equations (1) and (2):

$$\begin{aligned} P &= cPo \cdot \cos^2(vLHo \sin\omega t + \theta) \\ &= cPo/2[1 + \cos(2vLHo \cdot \sin\omega t + 2\theta)] \\ &= cPo/2 [1 + \cos(2vLHo \cdot \sin\omega t) \cos(2\theta) - \\ &\quad \sin(2vLHo \cdot \sin\omega t) \sin(2\theta)] \end{aligned} \tag{3}$$

When the value vLHo in the equation (3) is sufficiently smaller than 1, the value may be approximated as follows:

$$\begin{aligned} P &= cPo \cdot \cos^2(vLHo \sin\omega t + \theta) \\ &= cPo/2[1 + \cos(2vLHo \cdot \sin\omega t + 2\theta)] \\ &= cPo/2 [1 + \cos(2vLHo \cdot \sin\omega t) \cos(2\theta) - \\ &\quad \sin(2vLHo \cdot \sin\omega t) \sin(2\theta)] \end{aligned} \tag{3}$$

Therefore, the equation (3) may be converted into the following equation (4):

$$P = cPo/2[1 + \cos(2\theta) - 2vLHo \cdot \sin \omega t \cdot \sin(2\theta) + (vLHo)^2 \cdot \cos 2\omega t \cdot \cos(2\theta)] \tag{4}$$

Thus, the intensity P of the output beam is expressed by a function which includes an AC component having the frequency $\omega$ and an AC component having the frequency $2\omega$.

Generally, the relative angular difference $\theta$ between the polarizer and the analyzer indicated above is set at 45°, in order to obtain a large degree of beam modulation and improve the linearility between the output beam intensity P and the strength of the magnetic field. In this case, the above equation (4) is given as the following equation (5):

$$P = cPo/2[1 + 2vLHo \cdot \sin \omega t] \tag{5}$$

the output beam intensity P is expressed by a function which includes only an AC component having the frequency $\omega$ which is proportional to the magnetic field strength.

Where the relative angular difference $\theta$ is set at 0°, the above equation (4) may be approximated as the following equation (6):

$$P = cPo/2[2 + (vLHo)^2 \cdot \cos 2\omega t] \tag{6}$$

In this case, the output beam intensity P is expressed by a function which includes only an AC component having the frequency $2\omega$.

It will be apparent from the equations (5) and (6) that the intensity P of the output beam emitted from the analyzer is expressed by a function which includes only an AC component having the frequency $\omega$ or the frequency $2\omega$, depending upon the relative angular difference $\theta$ between polarized axes of the polarizer and the analyzer. The equation (4) is a functional equation which includes the AC components having the frequencies $\omega$ and $2\omega$.

On the other hand, the Pockel's effect is a phenomenon in which the phase of a light beam which is transmitted through a Pockel's-effect element is modulated according to the intensity of an electric field to which the Pockel's-effect element is exposed. An electric field sensor which utilizes the Pockel's effect is operated according to the principle substantially similar to that described above with respect to a sensor utilizing the Faraday-effect element. Namely, the intensity P of the output beam optically biased by a retardation plate as indicated in FIG. 2 may be expressed by a function which includes only an AC component having the frequency $\omega$ or $2\omega$, or the two AC components having the frequencies $\omega$ and $2\omega$.

Figure 2:
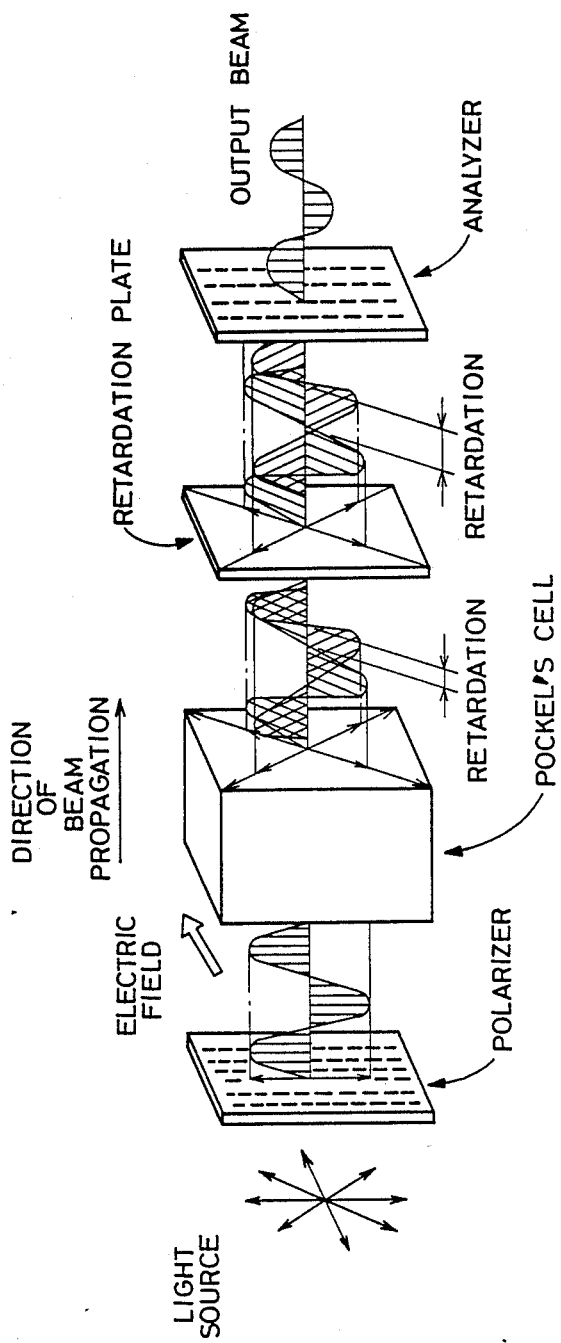

In the arrangement of FIG. 2 using a Pockel's-effect element for measuring an electric field strength, a light beam from the light source is linearly polarized by the polarizer, as in the arrangement of FIG. 1. The linearly polarized beam is then transmitted through the Pockel's-effect element while exposed to an electric field. As a result, there arises a phase difference between the two propagation modes of the linearly polarized beam, whereby the output beam from the Pockel's-effect element is elliptically polarized. The elliptically polarized beam is optically biased into a circularly polarized beam, by the retardation plate disposed between the Pockel's-effect element and the analyzer. The circularly polarized beam is incident upon the analyzer, so that the intensity of the beam emitted from the analyzer represents the strength of the electric field to which the Pockel's-effect element is exposed. The output beam from the analyzer is received by a suitable light-sensitive detector, which produces an electric signal representative of the electric field strength.

When the relative angular difference $\theta$ between the polarized axes of the polarizer and analyzer of the electric field sensor is set at 0° (when the polarizer and analyzer have the parallel polarized axes) as indicated in FIG. 2, the output beam intensity P is expressed by the following equation (7) where the incident beam is propagated through a crystal of lithium niobate (LiNbO$_3$) as the Pockel's-effect element, in the Z axis direction of the crystal:

$$P = cPo \cdot \cos[(\phi + \psi)/2] \tag{7}$$

The equation (7) may be developed into the following equation (8):

$$P = cPo \cdot \cos^2[(\pi/V\pi \cdot V + \psi)/2] \quad (8)$$
$$= cPo/2[1 + \cos(\pi/V\pi \cdot V + \psi)]$$
$$= cPo/2\,[1 + \cos(\pi/V\pi \cdot V) \cdot \cos(\psi) - \sin(\pi/V\pi \cdot V) \cdot \sin(\psi)]$$
$$= cPo/2\,[1 + \cos(\psi) - \pi/V\pi \cdot Vo \cdot \sin\omega t \cdot \sin(\psi) + \tfrac{1}{4} \cdot (\pi/V\pi)^2 \cdot Vo^2 \cdot \cos 2\omega t \cdot \cos(\psi)]$$

where,
P: Intensity of the output beam
c: Proportion constant
Po: Intensity of the incident beam
$\phi$: Retardation
$\psi$: Optical bias
V$\pi$: Half-wave voltage $(=\lambda d/2no^3 \gamma_{22} L)$
V: Voltage applied to the Pockel's-effect element
Vo sin $\omega$t: AC voltage having the frequency $\omega$ applied to the Pockel's-effect element, where
Vo: amplitude, t: time
$\lambda$: Wavelength of the light beam produced by the light source
d: Distance between the electrodes through which the voltage is applied to the Pockel's-effect element
no: Refractive index of ordinary rays
$\lambda_{22}$: Pockel's constant
L: Length of the Pockel's-effect element Generally, the optical bias $\psi$ indicated above is set at 90°, in order to obtain a large degree of beam modulation and improve the linearility between the output beam intensity P and the applied voltage. In this case, the above equation (8) is given as the following equation (9):

$$P = cPo/2[1 - \pi/V\pi \cdot Vo \cdot \sin\omega t] \quad (9)$$

Thus, the output beam intensity P is expressed by a function which includes only an AC component having the frequency $\omega$ which is proportional to the voltage applied to the Pockel's-effect element.

Where the phase plate is not provided, i.e., where the optical bias $\psi$ is set at 0°, the above equation (8) may be converted into the following equation (10):

$$P = cPo/2[2 + \tfrac{1}{4} \cdot (\pi/V\pi)^2 \cdot Vo^2 \cdot \cos 2\omega t] \quad (10)$$

In this case, the output beam intensity P is expressed by a function which includes only an AC component having the frequency 2$\omega$.

It will be understood from the above analysis that the AC component of the modulated beam having the frequency $\omega$, and the AC component having the fequency 2 $\omega$ may be suitably used for a single optical sensor to measure a magnetic field strength and a voltage applied to the Faraday-effect or Pockel's-effect element, by changing the relative angular difference $\theta$ between the polarizer and analyzer, or the optical bias $\psi$ given by the retardation. For instance, the AC component having the frequency $\omega$ can be retrieved as an output which varies with the magnetic field strength, while the AC component having the frequency 2$\omega$ can be retrieved as an output which varies with the level of the voltage. This will be apparent from the above equations (5) and (10). It will also be apparent from the above equations (6) and (9) that the AC component having the frequency $\omega$ can be used as an output which varies with the voltage, while the AC component having the frequency 2 $\omega$ can be used as an output which varies with the magnetic field strength.

In summary, the modulated beam consisting of the two components having the frequencies $\omega$ and 2$\omega$ is converted into an electric signal by a suitable light-sensitive means. The electric signal is then divided into a component having the frequency $\omega$ and a component having the frequency 2$\omega$. The magnitudes of these components are measured to determine the strength of an AC magnetic field applied to the optical sensor, or a current which produces the AC magnetic field, and/or a voltage or the strength of an AC electric field which produces the voltage. In the measurement of these quantities, it is preferable to electrically process the component having the frequency 2$\omega$, so as to obtain a square root of the component, so that the sensor provides an output which is proportional to the electric quantity to which the sensor is exposed. Further, by multiplying the amounts of the thus determined current and voltage, the amount of electric power can be obtained. As described above, the present invention provides an optical sensor which is capable of effecting measurements of a voltage (electric field strength) and a current (magnetic field strength), and a concurrent measurement of an electric power, by using a single light beam.

PREFERRED EMBODIMENTS

Figure 3:
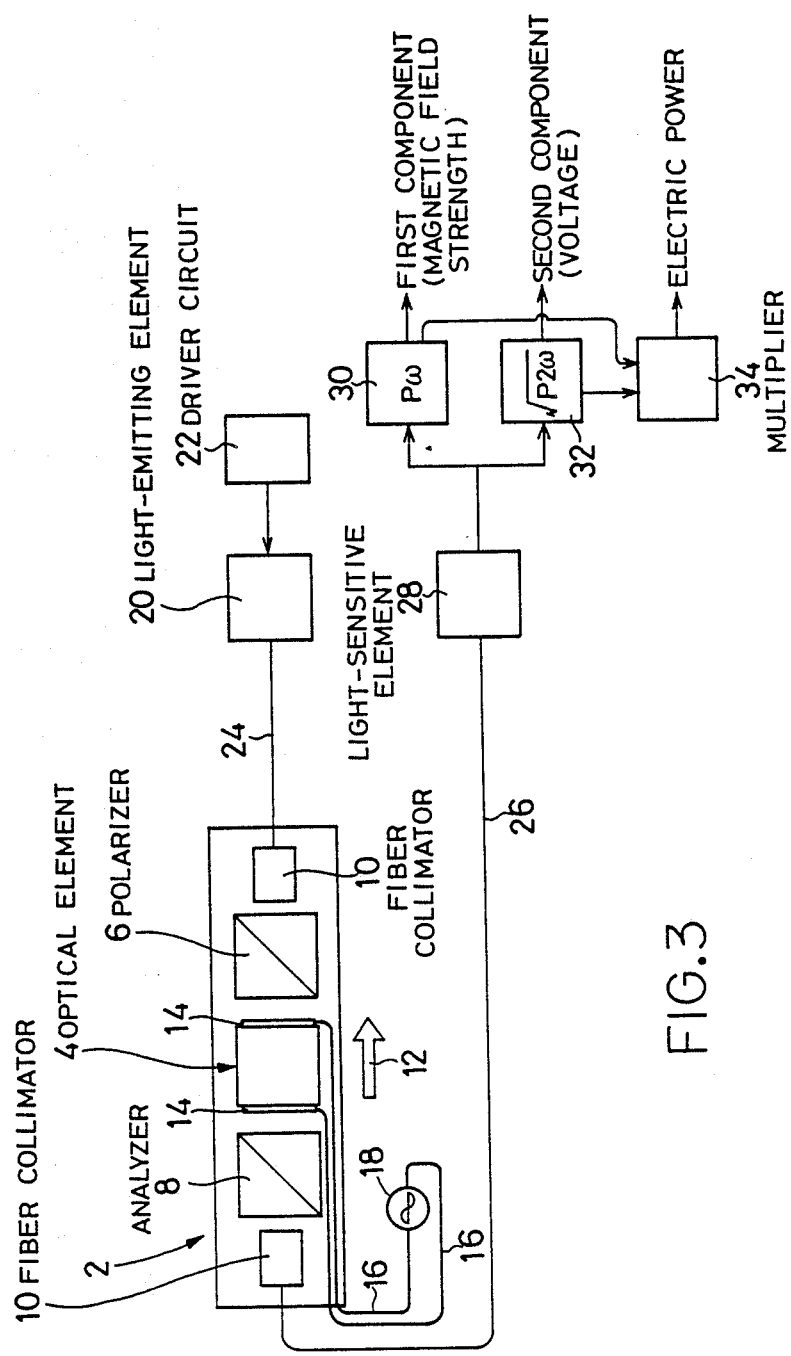
FIGS. 3 and 4 are schematic block diagrams illustrating different embodiments of an optical apparatus of the invention for measuring electric and magnetic quantities.
Figure 4:
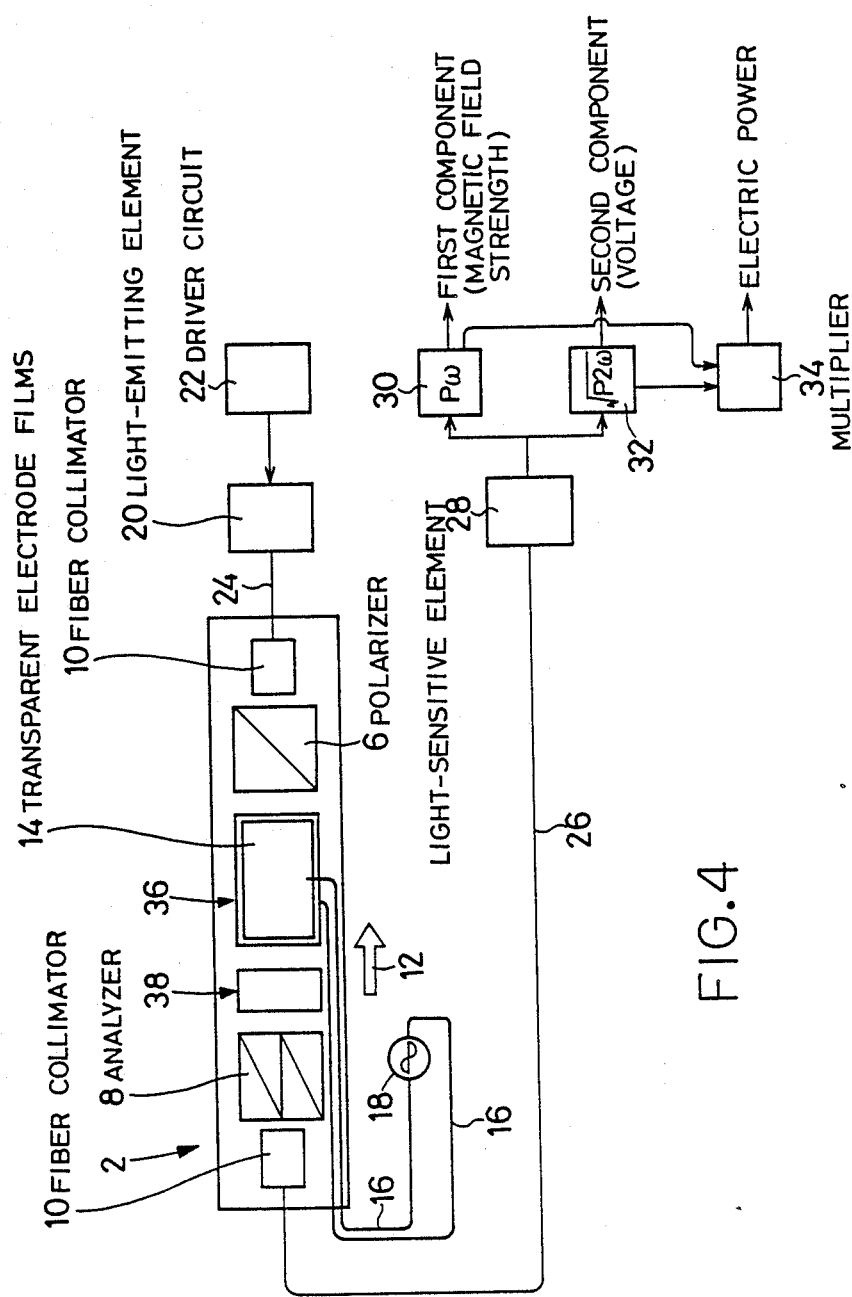

Referring next to FIGS. 3 and 4, there will be described two different presently preferred examples of an apparatus for optically measuring electric and magnetic quantities according to the principles of the present invention.

In the optical sensor illustrated in FIG. 3, reference numeral 2 designates an optical sensing head, which includes optical sensing means in the form of an optical element 4 formed of an optical material which exhibits both the Pockel's effect and the Faraday effect. The sensing head 2 further includes a polarizer 6 and an analyzer 8 which are disposed on the opposite sides (on the right and left sides, as viewed in FIG. 3) of the optical element 4, in the direction in which a light beam is propagated through the element 2 as described below. Thus, the optical element 4 is disposed between the polarizer 6 and the analyzer 8 in the direction of propagation of the light beam. A fiber collimator 10 is disposed on the outer side of each of the polarizer 6 and analyzer 8, namely, on the side remote from the optical element 4. In operation of the apparatus, the optical element 4 of the sensing head 2 is exposed to an AC magnetic field 12, whose strength is measured by the apparatus. The optical element 4 is also exposed to an AC electric field whose strength is measured. The AC electric field is applied through two transparent electrode films 14, 14 formed on the opposite surfaces of the optical element 4 which face the polarizer and analyzer 6, 8. More specifically, the electrode films 14, 14 are connected to an AC voltage generator 18 through electrical lead wires 16, 16.

The apparatus has light-emitting means in the form of a light-emitting element 20, and a driver circuit 22 for activating the light-emitting element 20. The element 20 produces a light beam having a suitably adjusted intensity. The light beam emitted from the light-emitting element 20 is directed through an optical fiber 24 to the incoming-side fiber collimator 10, and is transmitted through the optical sensing head 2. The light-emitting element 20 may be a light-emitting diode, or a He-Ne laser source.

While the light beam from the light-emitting element 20 is transmitted through the optical element 4, the light beam is optically modulated by the AC magnetic field 12, and by the AC electric field applied through the transparent electrode films 14, 14, according to the strengths of these magnetic and electric fields.

The light beam which is transmitted through and thus modulated by the sensing head 2 is emitted from the outgoing-side fiber collimator 10 and directed through an optical fiber 26 to light-sensitive means in the form of a light-sensitive element 28 such as a PIN photodiode. The light-sensitive element 28 converts the received light beam, i.e., optical signal, into an electric signal which is equivalent to the optical signal.

The electric signal produced by the light-sensitive element 28 is applied to a first component detector 30 and a second component detector 32, each of which consists of a suitable phase sensitive detector. These detectors 30, 32 are adapted to produce respective frequency components of the received electric signal, as their output signals. Described more particularly, the first component detector 30 serves as first-component retrieving means for retrieving a first component P$\omega$ of the received electric signal which has a same frequency as that of the AC magnetic field or AC electric field applied to the optical element 4. On the other hand, the second detector 32 serves as second-component retrieving means for retrieving a second component P2$\omega$ of the received electric signal which has an frequency which is two times that of the AC magnetic or electric field applied to the optical element 4. The second component detector 32 incorporates a circuit for obtaining a square root $\sqrt{P2\omega}$ of the second component signal P2$\omega$. Thus, these two detectors 30, 32 produce the first and second component signals which are proportional to the electric and magnetic quantities applied to the optical element 4 of the optical sensing head 2.

In the apparatus constructed as described above, the strength of the AC magnetic field, or the amount of current which produces the AC magnetic field is measured or determined based on one of the first and second component signals P$\omega$ and $\sqrt{P2\omega}$, while the strength of the AC electric field, or the level of voltage which produces the AC electric field is measured or determined based on the other of the first and second component signals. For example, the strength of the AC magnetic field is measured based on the first component signal P$\omega$ produced by the first component detector 30, while the voltage is measured based on the second component signal $\sqrt{P2\omega}$ produced by the second component detector 32.

The first and second component signals produced by the first and second component detectors 30, 32 are applied to arithmetic means in the form of a multiplier 34 which is adapted to multiply the first component signal P$\omega$ by the second component signal $\sqrt{P2\omega}$. The multiplier 34 produces an electric signal indicative of a product obtained as a result of the multiplication, i.e., the amount of electric power applied to the optical element 4.

Referring to FIG. 4, there is shown another embodiment of the optical sensor of the invention, which is different from the preceding embodiment of FIG. 3 in that the optical sensing means of the sensing head 2 consists of two separate optical elements 36 and 38. More specifically, the optical element 36 is a Pockel's-effect element formed of an optical material which exhibits the Pockel's effect, while the optical element 38 is a Faraday-effect element formed of an optical material which exhibits the Faraday effect. In the present embodiment, the transparent electrode films 14, 14 for applying an AC electric field are formed on the opposite surfaces of the Pockel's-effect element 36 which are opposed to each other in the direction perpendicular to the direction of propagation of the light beam through the sensing head 2. In other words, the direction of the electric field is perpendicular to the direction of propagation of the light beam.

In the optical sensor constructed as described above, the light beam emitted from the light-emitting element 20 and transmitted through the sensing head 2 is optically modulated by the AC electric field applied to the Pockel's-effect element 36 through the electrode films 14, and is further modulated by the AC magnetic field 12 applied to the Faraday-effect element 38.

For compensating for a variation in the amount of light beam while travelling through the optical path of the apparatus, it is desirable that the AC component signals P$\omega$ and $\sqrt{P2\omega}$ produced by the first and second component detectors 30, 32 be divided by the DC components. Alternatively, the output signal of the light-sensitive element 28 may be fed back to the driver circuit 22 for controlling the drive signal applied to the light-emitting element 20, for regulating the optical output of the element 20 so that the outputs of the detectors 30, 32 are stabilized irrespective of the variation of the light beam associated with the optical path.

While the first and second component detectors 30, 32 used in the above embodiments each consist of a phase sensitive detector for retrieving the first and second components $\omega$ and 2$\omega$ of the electric signal produced by the light-sensitive element 28, the phase sensitive detector may be replaced by other suitable electrically filtering means such as a bandpass filter circuit.

The optical sensing means 4, or 36 and 38 of the sensing head 2 is interposed between the polarizer 6 and the analyzer 8, as described above. If necessary and desired, a phase plate may be disposed at a suitable position. The optical sensing means may consist of either a mass (crystal) of an optical material which exhibits both the Pockel's effect and the Faraday effect as in the embodiment of FIG. 3, or two separate masses (crystals) of respective optical materials exhibiting the Pockel's and Faraday effects as in the embodiment of FIG. 4. For example, the Pockel's-effect element 36 may be formed of LiNbO$_3$, LiTaO$_3$, KDP, ADP, quartz or PLZT, and the Faraday-effect element 38 may be formed of YIG, ZnSe or Faraday glasses. Examples of the optical materials which exhibit the Pockel's and Faraday effects include BSO (Bi$_{12}$SiO$_{20}$) and BGO (Bi$_{12}$GeO$_{20}$).

The features and advantages of the present invention which have been described will be further clarified by the following description of Examples.

EXAMPLE 1

Measurements were conducted by using the optical sensor constructed according to the embodiment of FIG. 3. An LED (light-emitting diode) adapted to emit a light beam having a wavelength of 0.85 micrometer was used as the light-emitting element 20, and a PIN photodiode was used as the light-sensitive element 28. A single crystal of BSO was used as the optical sensing means 4 of the sensing head 2, while polarizing beam splitters (PBS) were used as the polarizer and analyzer 6, 8. These polarizer and analyzer were arranged such that the relative angular difference of polarized axes was 0°. The BSO single crystal as the optical sensing means 4 was oriented such that the light beam was transmitted in the direction of the crystallographic axis [100]. The length of the BSO crystal 4 in the direction of propagation of the light beam was 4 mm. The electrode films 14, 14 through which a voltage was applied to the BSO crystal were formed on the opposite surfaces of the crystal which are opposed to each other in the direction of propagation of the beam.

The light beam emitted from the LED 20 was modulated by the sensing head 2, and the modulated beam was received by the PIN photodiode 28, which converted the received optical signal into an equivalent electric signal. The electric signal produced by the photodiode 28 was monitored by a spectrum analyzer. Described more specifically, the sensing head 2 was placed within a solenoid coil winding, and was exposed to an AC magnetic field of 0–100 Oe (50 Hz) and an AC voltage of 0–100 V (50 Hz). The spectra of the electric signal from the photodiode 28 were observed by the spectrum analyzer, and the levels of the 50 Hz component (first component) and the 100 Hz component (second component) of the electric signal were measured.

Figure 5:
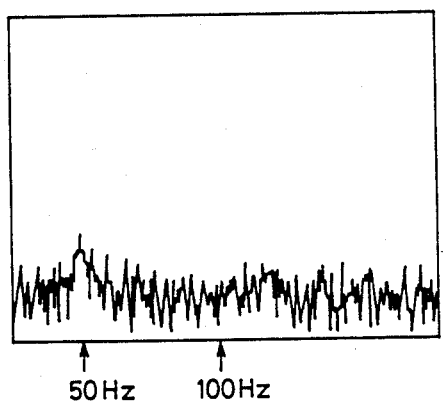
FIGS. 5, 6 and 7 are graphs showing spectra obtained in Example 1, while the strength of a magentic field and the voltage were changed.
Figure 6:
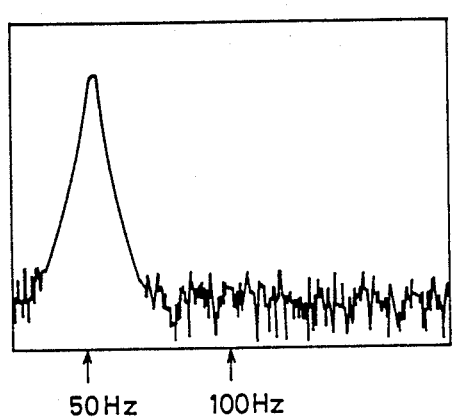
Figure 7:
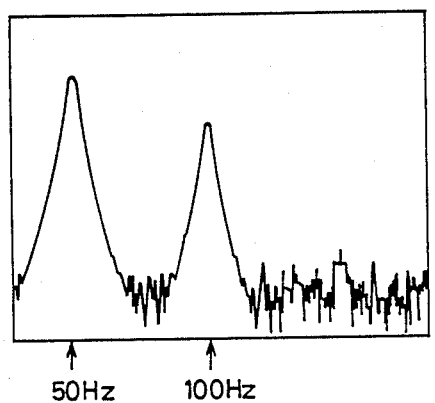

The spectra of the electric output of the photodiode 28 were observed while no magnetic and electric fields were applied to the BSO crystal 4. The observed spectra are shown in FIG. 5. Then, the solenoid coil was energized by a constant current to form a magnetic field of 50 Oe (oersteds). The spectra observed in this condition are shown in FIG. 6, which indicates a 50 Hz signal. In the same condition, a voltage of 50 V was applied to the sensing head 2. The spectra observed indicates the presence of a 100 Hz peak signal in addition to the 50 Hz signal, as indicated in FIG. 7.

Figure 8A:
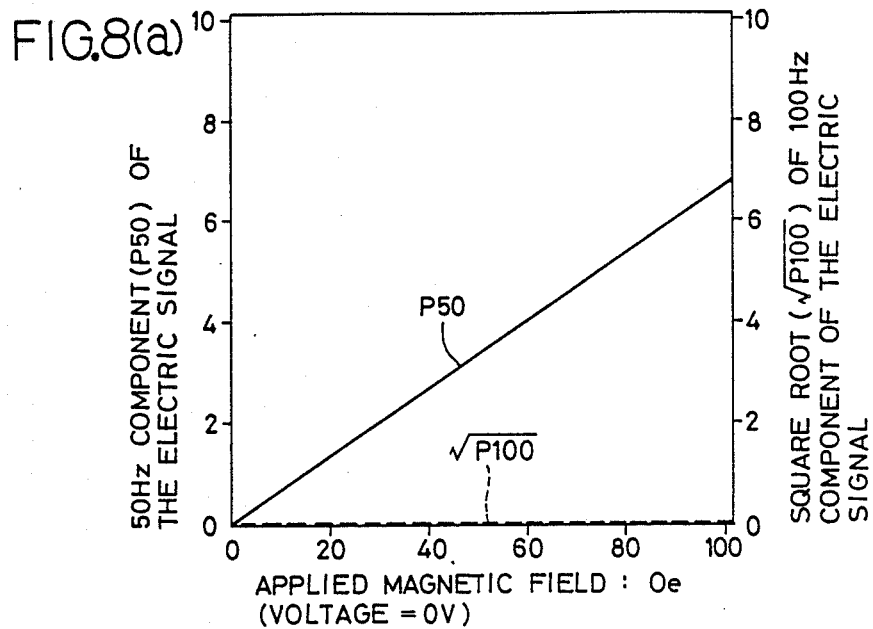
FIGS. 9(a)–8(c) and FIGS. 9(a)–9(c) are graphs indicating relationships between a 50 Hz component or a square root of a 100 Hz component of the output obtained in Example 1, and the magnetic field strength or voltage.
Figure 8B:
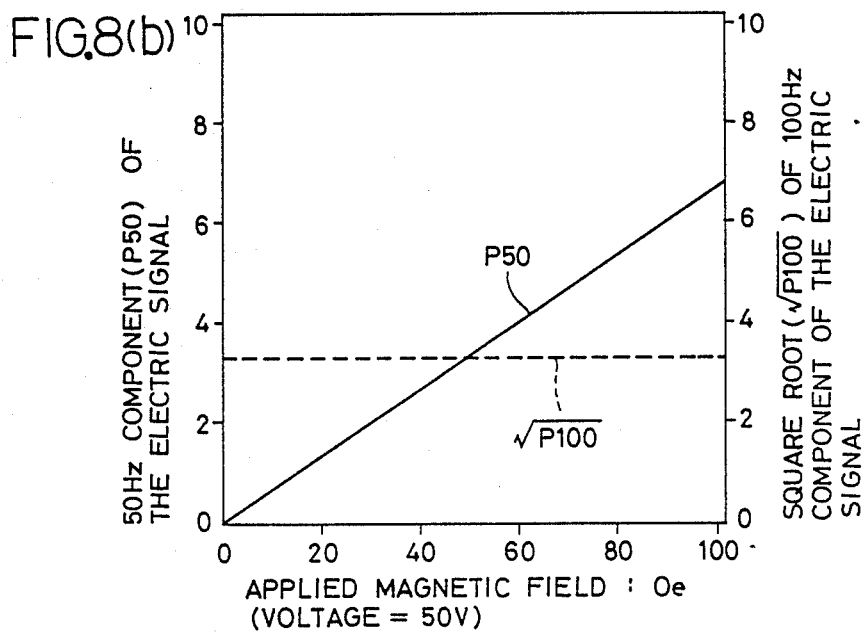

Then, the voltage was changed in three steps, i.e., 0 V, 50 V and 100 V. For each of these three voltage levels, the magnetic field strength was varied from 0 Oe to 100 Oe. The 50 Hz component $P_{50}$ of the obtained electric output signals of the photodiode 28, and the square root $\sqrt{P_{100}}$ of the 100 Hz component were measured. The measurements are indicated in FIGS. 8(a), 8(b) and 8(c), wherein the 50 Hz component is indicated in solid lines while the square root of the 100 Hz component is indicated in dashed lines. It will be understood that the 50 Hz component increased in proportion to the strength of the magnetic field, while the square root of the 100 Hz component corresponded to the voltage level and was constant irrespective of the change in the magnetic field strength.

Figure 9A:
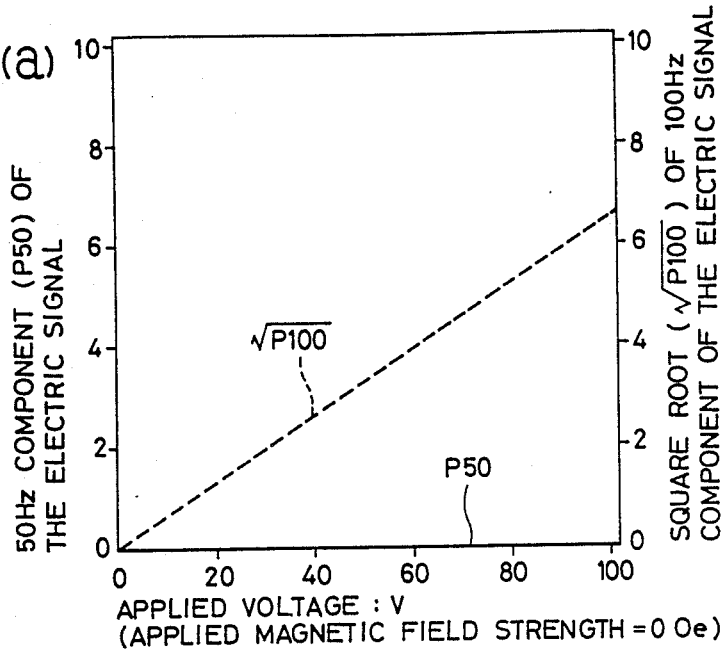
Figure 9B:
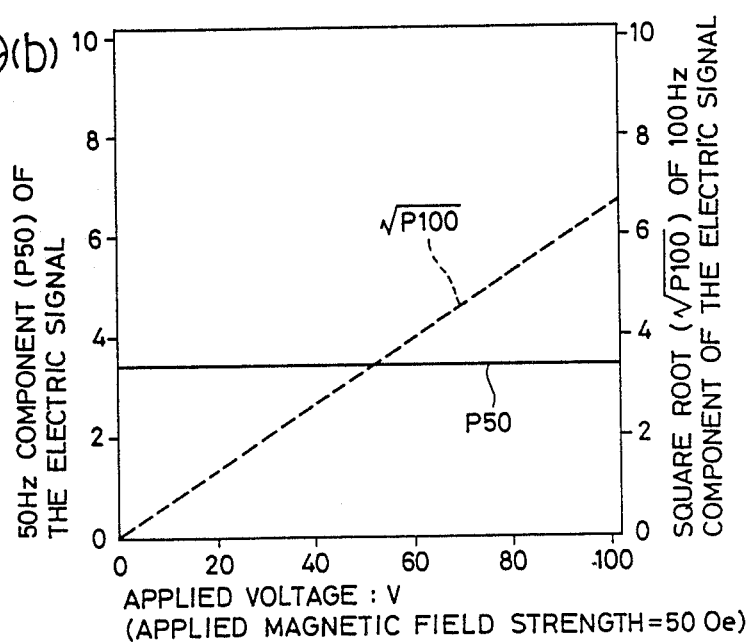
Figure 9C:
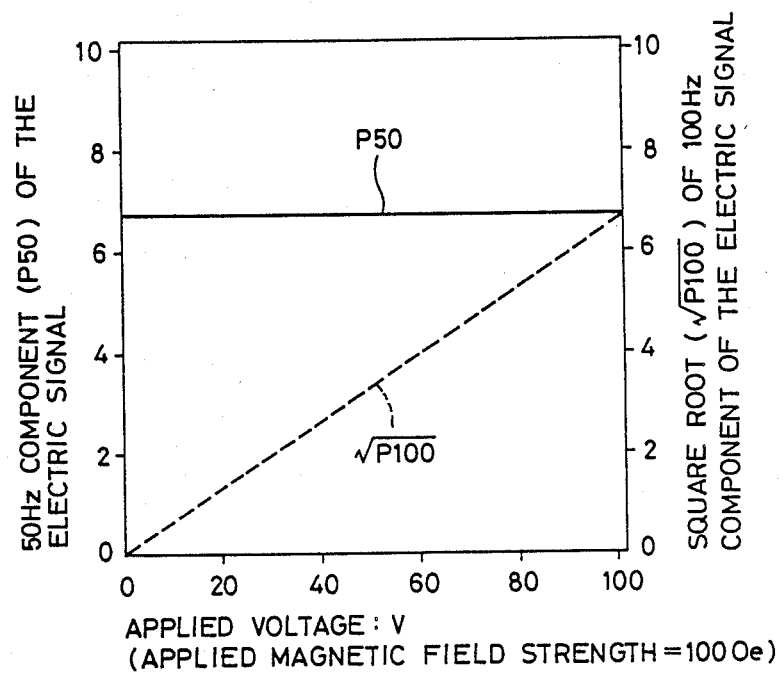

Further, the electric current (magnetic field strength) was changed in three steps, i.e., 0 Oe, 50 Oe and 100 Oe. For each of these three current values, the voltage was varied from 0 V to 100 V. The 50 Hz component $P_{50}$ of the output signal of the photodiode 28, and the square root $\sqrt{P_{100}}$ of the 100 Hz component were measured. The measurements are indicated in FIGS. 9(a), 9(b) and 9(c). As is apparent from these figures, the square root $\sqrt{P_{100}}$ of the 100 Hz component indicated in dashed lines increased in proportion to the voltage level, while the 50 Hz component $P_{50}$ indicated in solid lines corresponded to the magnetic field strength and was constant irrespective of the change in the magnetic field strength.

The results of the measurements revealed that the outputs of the photodiode 28 with respect to the varying voltage level and magnetic field strength were independent of each other. This was considered to be caused for the following reason:

That is, the BSO crystal 4 not only exhibits the Faraday and Pockel's effects, but also has an ability of optical rotatory power of a light beam transmitted therethrough. This ability causes the rotation of the polarization plane of the beam by an angle of about 45° when the length of the BSO crystal 14 in the direction of the crystallographic axis [100] is about 4 mm. Consequently, the sensing head 2 provides an output signal having a frequency equal to the frequency of the magnetic field applied to the BSO crystal 4, as indicated by the above equation (5). Further, the sensing head 2 provides an output signal having a frequency two times that of the applied voltage, as indicated in the above equation (10), since the application of a voltage causes a condition in which no optical bias is applied to a Pockel's-effect element (FIG. 2).

It will be recognized from the above description that the sensing head 2 which is simple in construction is capable of effecting accurate voltage and current measurements, such that the measurement of the voltage is independent of the measurement of the current.

EXAMPLE 2

Similar measurements as in Example 1 were conducted by using the optical sensor constructed according to the embodiment of FIG. 4. A YIG single crystal was used as the Faraday-effect element 38, while a LiNbO$_3$ single crystal was used as the Pockel's-effect element 36. The LiNbO$_3$ crystal was oriented such that the light beam was transmitted in the direction of the crystallographic Z axis. The length of the LiNbO$_3$ cyrstal in the Z axis direction was 7 mm. The electrode films 14 were formed on the opposite X axis surfaces of the LiNbO$_3$, for applying a voltage to the crystal. The Z axis length of the YIG crystal 38 was 1 mm. Polarizing beam splitters (PBS) were used as the polarizer 6 and analyzer 8. Similar results of measurements as obtained in Example 1 were obtained in Example 2.

The 50 Hz component and the square root of the 100 Hz component were obtained from the respective first and second component phase sensitive detectors 30, 32 which received the output signal of the photodiode 28. Thus, the voltage and the magnetic field which were applied to the sensing head 2 were measured. Further, the amount of electric power was measured based on a product obtained by multiplication by the multiplier 34 of the outputs of the two phase sensitive detectors 30, 32 which are indicative of the voltage and the magnetic field strength (current). Thus, the voltage (electric field strength), current (magnetic field strength) and electric power were simultaneously measured by the optical sensor shown in FIG. 4.

While the present invention has been described in its presently preferred embodiments, it is to be understood that the invention is not limited to the details of the illustrated embodiments, but may be embodied with various changes, modifications and improvements, which may occur to those skilled in the art, without departing from the spirit and scope of the invention defined in the following claims.

What is claimed is:

1. A method of optically measuring the strength of an AC electric field or a voltage which produces the AC electric field, or the strength of an AC magnetic field or a current which produces the AC magnetic field, based on a light beam which is transmitted through and thus modulated by optical sensing means due to the Pockel's effect and the Faraday effect, while the optical sensing means is exposed to the AC electric field and the AC magnetic field, the optical sensing means comprising an optical material which exhibits the Pockel's effect and another optical material which exhibits the Faraday effect, or comprising an optical material which exhibits both the Pockel's effect and the Faraday effect, said method comprising the steps of:

applying said light beam modulated by said optical sensing means to light-sensitive means;

retrieving a first component and a second component of an electric output signal produced by said light-sensitive means, said first component having a same frequency as that of said AC electric or magnetic field, while said second component having a frequency which is two times that of said AC electric or magnetic field; and determining the strength of said AC electric field or said voltage based on one of said first and second components, and the strength of said AC magnetic field or said current based on the other of said first and second components.

2. A method according to claim 1, further comprising a step of determining an amount of electric power based on the determined voltage and current.

3. An apparatus for optically measuring the strength of an AC electric field or a voltage which produces the AC electric field, or the strength of an AC magnetic field or a current which produces the AC magnetic field, the apparatus including (a) light-emitting means for producing a light beam, (b) a polarizer which receives said light beam, (c) optical sensing means through which said light beam which has passed through said polarizer is transmitted, said optical sensing means comprising an optical material which exhibits the Pockel's effect and another optical material which exhibits the Faraday effect, or comprising an optical material which exhibits both the Pockel's effect and the Faraday effect, said light beam being modulated while being transmitted through said optical sensing means, according to the strengths of said AC electric and magnetic fields to which said optical sensing means is exposed, (d) an analyzer through which the modulated light beam is transmitted, and (e) light-sensitive means receiving said modulated light beam from said analyzer, wherein the improvement comprises:

first-component retrieving means for retrieving a first component of an electric output signal produced by said light-sensitive means, said first component having a same frequency as that of said AC electric or magnetic field;

second-component retrieving means for retrieving a second component of said electric output signal of said light-sensitive means, said second component having a frequency which is two times that of said AC electric or magnetic field; and determining means for determining the strength of said AC electric field or said voltage based on one of said first and second components, and the strength of said AC magnetic field or said current based on the other of said first and second components.

4. An apparatus according to claim 3, further comprising means for determining an amount of electric power based on the voltage which is determined by said one component retrieved by one of said first-component and second-component retrieving means, and said other component retrieved by the other of said fist-component and second-component retrieving means.

5. An apparatus according to claim 3, wherein said second-component retrieving means produces an electric output signal indicative of a square root of said second component.

6. An apparatus according to claim 3, wherein said optical sensing means, said polarizer and said analyzer constitute a portion of an optical sensing head.

7. An apparatus according to claim 6, further comprising an optical fiber for optically connecting said sensing head and said light-sensitive means.

8. An apparatus according to claim 6, further comprising an optical fiber for optically connecting said light-emitting means and said optical sensing head.

9. An apparatus according to claim 3, wherein said optical sensing means consists of a single crystal of a material exhibiting both the Pockel's effect and the Faraday effect.

10. An apparatus according to claim 9, wherein said single crystal consists of $Bi_{12}SiO_{20}$ or $Bi_{12}GeO_{20}$.

11. An apparatus according to claim 3, wherein said optical sensing means consists of a first crystal of a material exhibiting the Pockel's effect, and a second crystal of a material exhibiting the Faraday effect.

12. An apparatus according to claim 11, wherein said first single crystal consists of $LiNbO_3$, $LiTaO_3$, KDP, ADP, quartz or PLZT.

13. An apparatus according to claim 11, wherein said second single crystal consists of YIG, ZnSe or Faraday glasses.

* * * * *